United States Patent [19]

Horiuchi et al.

[11] Patent Number: 5,032,895
[45] Date of Patent: Jul. 16, 1991

[54] SEMICONDUCTOR DEVICE AND METHOD OF PRODUCING THE SAME

[75] Inventors: Osamu Horiuchi, Akishima; Gen Murakami, Machida; Hiromichi Suzuki, Tokorozawa; Hajime Hasebe, Hakodate; Kanji Otsuka, Higashiyamato; Yuuji Shirai, Kodaira; Takayuki Okinaga; Takashi Emata, both of Akishima, all of Japan

[73] Assignees: Hitachi, Ltd.; Hitachi VLSI Engineering Corp., both of Tokyo, Japan

[21] Appl. No.: 510,844

[22] Filed: Apr. 18, 1990

[30] Foreign Application Priority Data

Apr. 27, 1989 [JP] Japan .................................. 1-105863

[51] Int. Cl.5 ..................... H01L 23/48; H01L 23/28; H01L 29/44; H01L 29/52
[52] U.S. Cl. ......................................... 357/72; 357/68; 357/69; 357/70; 361/421; 174/52.4
[58] Field of Search ....................... 357/70, 68, 72, 69, 357/80; 361/421; 174/52.4

[56] References Cited

U.S. PATENT DOCUMENTS

| 4,534,105 | 8/1985 | Reusch | 29/589 |
| 4,714,952 | 12/1987 | Takekawa | 357/75 |
| 4,800,419 | 1/1989 | Long et al. | 357/70 |
| 4,835,120 | 5/1989 | Mallik et al. | 437/209 |
| 4,884,124 | 11/1989 | Mori et al. | 357/72 |

Primary Examiner—Rolf Hille
Assistant Examiner—David Ostrowski
Attorney, Agent, or Firm—Antonelli, Terry, Stout & Kraus

[57] ABSTRACT

A semiconductor device comprising the fact that a semiconductor pellet is arranged on a substantially central part of a film base in which a metal plate is overlaid with an insulating member, while inner leads are arranged on a peripheral part of the film base in a state in which they are electrically isolated from the metal plate of the film base, and that external terminals for a power source among external terminals of the semiconductor pellet and middle parts of the metal plate of the film base, and inner leads for the power source among the inner leads and peripheral parts of the metal plate are electrically connected by pieces of bonding wire, respectively.

13 Claims, 5 Drawing Sheets

SEMICONDUCTOR DEVICE AND METHOD OF PRODUCING THE SAME

BACKGROUND OF THE INVENTION

The present invention relates to a semiconductor device and a method of producing the same. More particularly, it relates to techniques which are effective when applied to a resin-encapsulated semiconductor device.

A resin-encapsulated semiconductor device having a packaging density, there is the flat packaging type of QFP (Quad Flat Package) structure. The resin-encapsulated semiconductor device of the QFP structure is so constructed that a semiconductor pellet mounted on the front surface of a tab is sealed in a resin mold. The tab is arranged so as to be enclosed with the base ends of a plurality of inner leads radiately extended in four directions. The other end sides of the inner leads are made so as to be unitary with outer leads. The tab, the inner leads and the outer leads are all formed from an identical lead frame. The lead frame is fabricated by punching or etching. The base ends of the inner leads and the corresponding external terminals (bonding pads) of the semiconductor pellet are electrically connected by pieces of bonding wire, respectively.

Regarding the resin-encapsulated semiconductor device of the QFP structure, the number of the outer leads (the number of pins) tends to increase. A resin-encapsulated semiconductor device which is being developing, is provided with 200 or more outer leads though not publicly known. The resin-encapsulated semiconductor device of the QFP structure with so many pins has its outward size enlarged and its leads thined on account of limitation on the pitches between the leads. In particular, the inner leads concentrate toward the mounted position of the semiconductor pellet and are therefore made still finer than the outer leads. In addition, since the semiconductor pellet is reduced in size on account of a heightened density of integration, the inner leads become longer inevitably. Thining and lengthening the leads result in increasing inductance. Among the leads, leads for power sources undergo great currents when circuits at the input and output stages of the semiconductor pellet operate at the same time. Due to the inductance components mentioned above, large currents incur fluctuations in supply voltage for use in circuits included in the semiconductor pellet and cause power source noise. For this reason, malfunctions often occur in the circuits built in the semiconductor pellet, so that the electrical reliability of the resin-encapsulated semiconductor device degrades.

A technique disclosed in U. S. Pat. No. 4,835,120 is effective for solving such a technical problem. The technique consists in furnishing a resin-encapsulated semiconductor device of QFP structure with a metal plate for a power source. The metal plate for the power source is arranged in opposite the inner leads through an insulator. It is electrically connected with the external terminal of the semiconductor pellet near this external terminal by a bonding wire. Also, it is electrically connected with the end side of the power-source inner lead remote from the external terminal by welding. That is, the power-source metal plate is inserted electrically in parallel with the power-source inner lead and can lower the inductance of the latter. Accordingly, the resin-encapsulated semiconductor device of the QFP structure can reduce the power source noise owing to the metal plate for the power source.

SUMMARY OF THE INVENTION

The inventors found the occurrence of the following problems in the aforecited resin-encapsulated semiconductor device of the QFP structure:

In the resin-encapsulated semiconductor device, the metal plate for the power source is connected to the external terminal of the semiconductor pellet and to the inner lead for the power source by two kinds of joining methods the wire bonding method and the welding method. This incurs the problem that the resin-encapsulated semiconductor device of the QFP structure becomes structurally complicated because of the complicated connection structure thereof with the power-source metal plate.

Another problem is that, since the resin-encapsulated semiconductor device of the QFP structure requires two connection steps, the production process thereof increases in the number of steps.

Besides, in case of using a plurality of sorts of supply voltages, a plurality of power-source metal plates as stated before need to be stacked. This leads to the problem that the resin-encapsulated semiconductor device of the QFP structure becomes more structurally complicated.

In the resin-encapsulated semiconductor device of the QFP structure, the metal plate for the power source is extended over the whole region of the resin mold, so that the bonding areas of a molding resin above and below the power-source metal plate decrease. This gives rise to the problem that the resin mold cracks due to moisture in the resin-encapsulated semiconductor device of the QFP structure.

Moreover, the extension of the power-source metal plate over the whole region of the resin mold results in narrowing the outflow paths of resin at the resin molding step. In consequence, the outward flowability of the resin is deteriorated to pose the problem that the available percentage of the articles of the resin-encapsulated semiconductor device of the QFP structure lowers due to the appearance of voids, etc.

In the resin-encapsulated semiconductor device of the QFP structure, the power-source metal plate and the insulating member are formed by punching. Since the power-source metal plate is ductile, the end face thereof is protruded as burrs during the punching. The burrs can short-circuit the power-source metal plate and the inner lead. This poses the problem that the electrical reliability of the resin-encapsulated semiconductor device of the QFP structure degrades.

Besides, in the resin-encapsulated semiconductor device of the QFP structure, the whole lower surface of the metal plate for the power source is exposed. The surface of that region of the power-source metal plate to which the bonding wire is bonded is provided with a gold (Au) plating layer. The Au plating layer is provided in order to attain an enhanced bondability. To this end, the Au plating layer is formed on the whole lower surface of the power-source metal plate. The amount of use of Au therefore increases to pose the problem of rise in the production cost of the resin-encapsulated semiconductor device of the QFP structure.

Moreover, the adhesion between the lower surface of the power-source metal plate and the resin mold is inferior in the resin-encapsulated semiconductor device of the QFP structure. Therefore, the power-source metal plate and the resin mold peel off at the interface thereof. The peeling causes cracks in the resin mold, resulting in the problem of deterioration in moisture proofing resin-encapsulated semiconductor device of the QFP structure.

An object of the present invention is to provide a technique capable of simplifying the structure of a resin-encapsulated semiconductor device.

Another object of the present invention is to provide a technique capable of decreasing the number of steps of the production process for a resin-encapsulated semiconductor device.

Another object of the present invention is to provide a technique capable of enhancing the moisture proofing of a resin-encapsulated semiconductor device.

Another object of the present invention is to provide a technique capable of enhancing the electrical reliability of a resin-encapsulated semiconductor device.

Another object of the present invention is to provide a technique capable of raising the available percentage of the articles of a resin-encapsulated semiconductor device.

Another object of the present invention is to provide a technique capable of reducing the production cost of a resin-encapsulated semiconductor device.

The above and other objects and novel features of the present invention will become apparent from the description in this specification when read in conjunction with the accompanying drawings.

Typical aspects of performance of the present invention are briefly summarized as follows:

(1) In a resin-encapsulated semiconductor device of QFP structure, a semiconductor pellet is arranged on a substantially central part of a film base in which a metal plate is overlaid with an insulating member, while inner leads are arranged on a peripheral part of the film base in a state in which they are electrically isolated from the metal plate of the film base, and external terminals for a power source among external terminals of the semiconductor pellet and middle parts of the metal plate of the film base, and inner leads for the power source among the inner leads and peripheral parts of the metal plate are electrically connected by pieces of bonding wire, respectively.

(2) In the aspect of performance (1), the metal plate of the film base is divided into a plurality of portions on an identical plane in correspondence with respective sorts of power source voltages.

(3) In the aspect of performance (1), a plurality of through holes are provided in the peripheral part of the film base.

(4) In the aspect of performance (1), a cutout is formed at that part of the film base which is close to a pouring gate for resin.

(5) In the aspect of performance (1), the film base has a square shape in plan, and cutouts are formed at all corners of the square shape of the film base.

(6) In the aspect of performance (1), that region of the peripheral part of the film base which is other than a region between the external terminals for the power source and outer ends of the inner leads for the power source is removed.

(7) In the aspect of performance (1), the insulating member of the film base is made somewhat larger in size than the metal plate thereof.

(8) In a method of producing the resin-encapsulated semiconductor device of QFP structure as defined in the aspect of performance (1), there are comprised the step of forming a film base in which a metal plate is overlaid with an insulating member having bonding recesses, the step of covering an exposed lower surface of the metal plate of the film with a covering member, the step of forming metal plating layers on those parts of an upper surface of the metal plate of the film base which are exposed through the bonding recesses of the insulating member, the step of arranging a semiconductor pellet on a substantially central part of the film base, and also arranging inner leads on a peripheral part of the film base in a state, in which they are electrically isolated from the metal plate of the film base, the step of electrically connecting external terminal,,s for a power source among external terminals of the semiconductor pellet and middle parts of the metal plate of the film base, and inner leads for the power source among the inner leads and peripheral parts of the metal plate by pieces of bonding wire through the metal plating layers, respectively, and the step of sealing all of the film base, the semiconductor pellet and the inner leads with a resin.

(9) In the aspect of performance (8), the metal plate of the film base is made smaller in size than each of the insulating member and the covering member.

(10) In any of the aspects of performance (1) thru (9), the semiconductor pellet is mounted on that part of the surface of the metal plate of the film base from which the insulating member has been removed.

(11) In any of the aspects of performance (1) thru (9), the semiconductor pellet is mounted on a surface of the insulating member of the film base, and a metal plating layer is provided on an exposed part of the surface of the metal plate of the film base.

According to the expedient (1), the external terminals for the power source and the metal plate, and the inner leads for the power source and the metal plate, which are in connecting positional relationships different from each other, can be connected by the wire bonding method alone (the welding method is dispensed with), so that a connecting structure with respect to the metal plate can be simplified to structurally simplify the resin-encapsulated semiconductor device of the QFP structure. Moreover, both the connection between the power-source external terminals and the metal plate and the connection between the power-source inner leads and the metal plate can be effected by one wire bonding step, so that the number of connecting steps can be reduced to relieve the production process for the resin-encapsulated semiconductor device of the QFP structure. In addition, the metal plate of the film base can lower the inductance components between the external terminals for the power source and outer leads for the power source, thereby to reduce power source noise, so that the malfunctions of the semiconductor pellet can be lessened to enhance the electrical reliability of the resin-encapsulated semiconductor device of the QFP structure. Besides, the metal plate of the film base can, in effect, increase the area of the rear surface of the semiconductor pellet, thereby to emit generated heat of the semiconductor pellet to the exterior through a resin mold with larger area, so that the heat radiation efficiency of the resin-encapsulated semiconductor device of the QFP structure can be raised.

According to the expedient (2), the number of layers of the metal plate of the film base can be decreased to simplify the structure of the film base, so that the structure of the resin-encapsulated semiconductor device can be simplified.

According to the expedient (3), the resin above and below the film base can be bonded through the through holes, so that the cracks of a resin mold and the peeling between the film base and the resin can be prevented to enhance moisture proofing of the resin-encapsulated semiconductor device of the QFP structure.

According to the expedient (4), the outflow paths of the resin which flows above and below the film base can be increased to render the flowability of the resin favorable, so that the appearance of voids can be diminished to enhance the available percentage of the articles of the resin-encapsulated semiconductor device of the QFP structure.

According to the expedient (5), the outflow paths of resin which flows above and below the film base are increased more and are endowed with symmetries, whereby the flowability of the resin can be rendered more favorable, so that the available percentage of the articles of the resin-encapsulated semiconductor device of the QFP structure can be enhanced.

According to the expedient (6), the parts of a resin above and below the film base can be bonded in the removed region of the peripheral part of the film base, so that the cracks of a resin mold and the peeling between the film base and the resin can be prevented to enhance the moisture proofing of the resin-encapsulated semiconductor device the QFP structure, and simultaneously, the outflow paths of the resin which flow above and below the film base can be increased to render the flowability of the resin favorable, so that the appearance of voids can be diminished to enhance the available percentage of the articles of the resin-encapsulated semiconductor device of the QFP structure.

According to the expedient (7), in punching the film base, a punching tool does not abut against the metal plate, and burrs do not appear on the end face of the metal plate, so that the short-circuiting between the metal plate and the inner leads is prevented to enhance the electrical reliability of the resin-encapsulated semiconductor device of the QFP structure. Moreover, the separation between the end part of the metal plate of the film base and each of the inner leads can be increased by the insulating member, so that the short-circuiting between them can be prevented to enhance the electrical reliability of the resin-encapsulated semiconductor device of the QFP structure.

According to the expedient (8), the metal plating layers can be formed on only those parts of the front surface of the metal plate which are defined by the bonding recesses formed in the insulating member of the film base, so that the amount of use of metal for the metal plating layers can be decreased to lower the production cost of the resin-encapsulated semiconductor device of the QFP structure.

According to the expedient (9), the end part of the metal plate of the film base can be covered with the covering member, so that the amount of use of the metal for the metal plating layers can be further decreased to lower the production cost of the resin-encapsulated semiconductor device of the QFP structure.

According to the expedient (10), the thermal resistance of a heat emission path on the side of the rear surface of the semiconductor pellet can be lowered in correspondence with the removed part of the insulating member of the film base, so that the heat radiation efficiency of the resin-encapsulated semiconductor device of the QFP structure can be raised.

According to the expedient (11), regions in which the metal plating layers are provided can be decreased in correspondence with the area of the film base for arranging the semiconductor pellet, so that the production cost of the resin-encapsulated semiconductor device of the QFP structure can be lowered.

DESCRIPTION OF THE PREFERRED EMBODIMENTS

Now, the construction of the present invention will be described in conjunction with embodiments in which the present invention is applied to a resin-encapsulated semiconductor device adopting a QFP structure.

Throughout the drawings for describing the embodiments, the same symbols are assigned to components having identical functions, which shall not be repeatedly explained.

Figure 1:
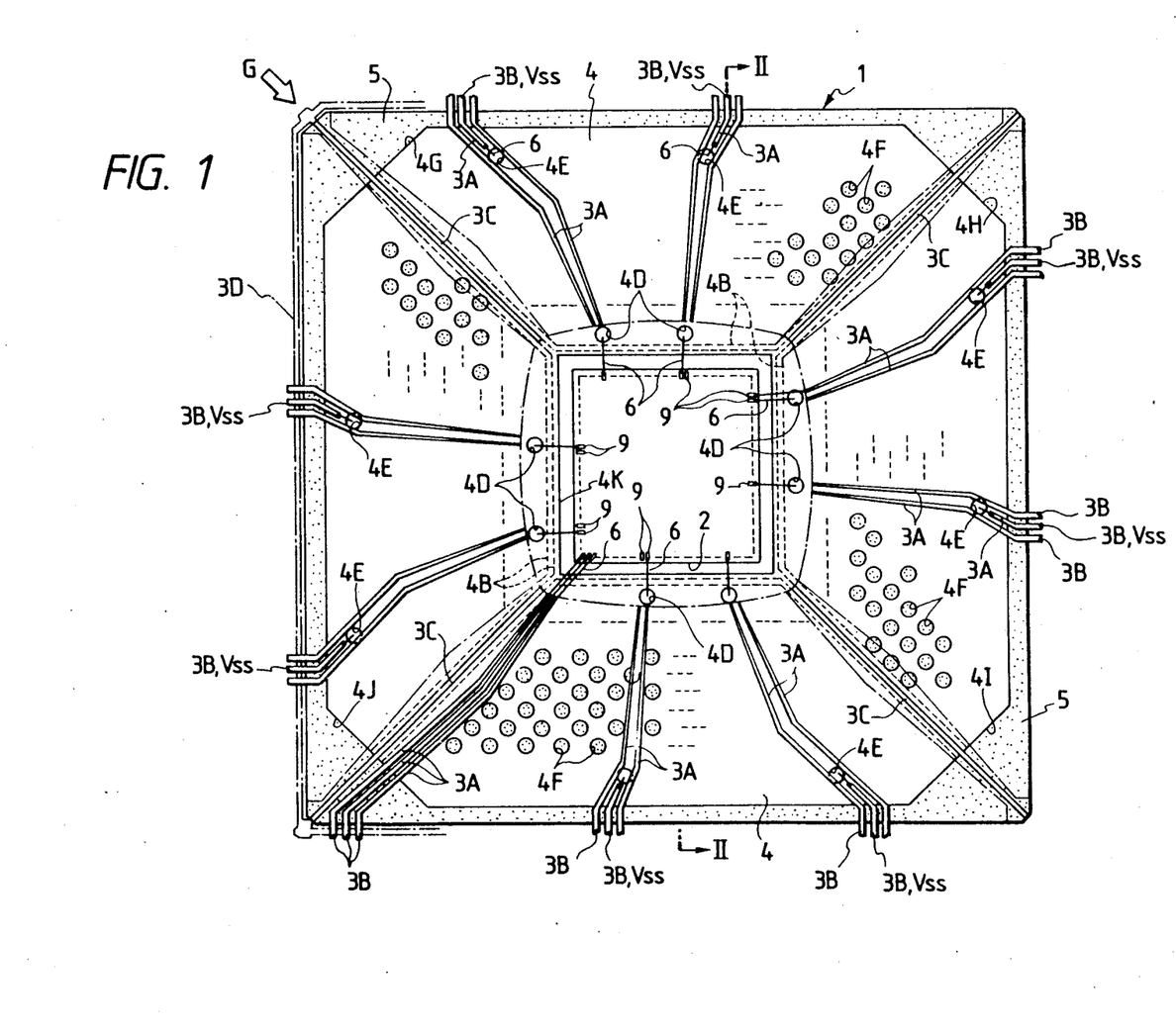
FIG. 1 is a plan view of the essential portions of a resin-encapsulated semiconductor device of QFP structure according to the present invention.
Figure 2:
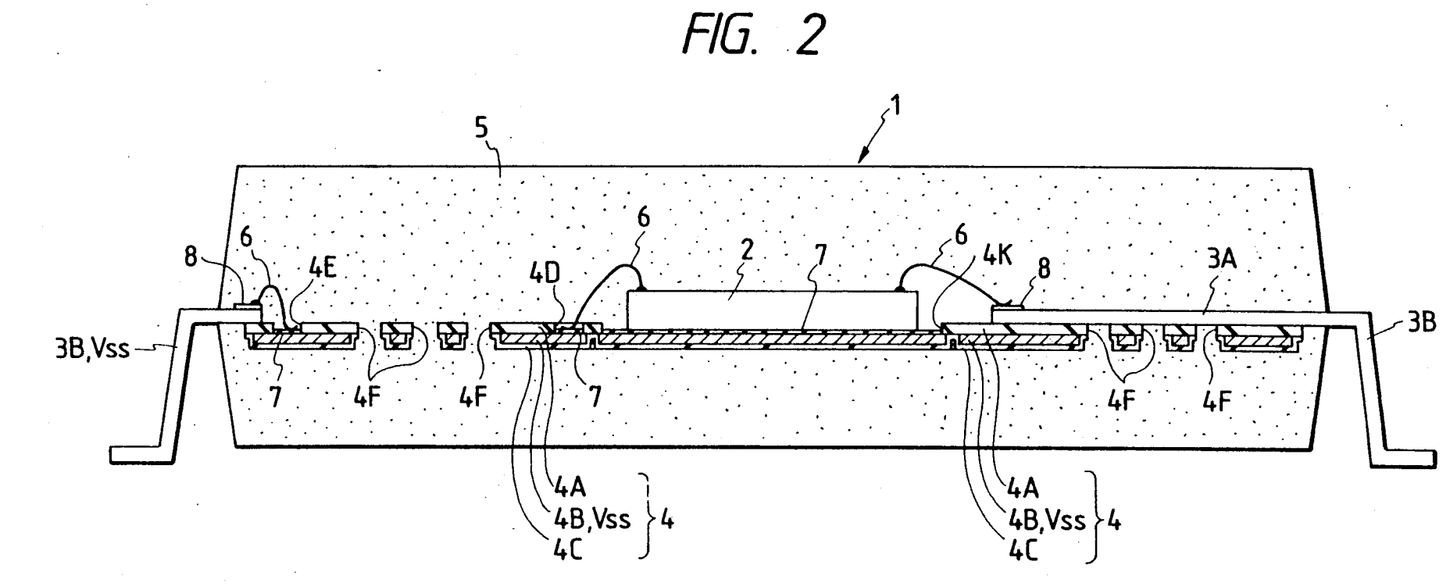
FIG. 2 is a sectional view of the essential portions of the resin-encapsulated semiconductor device according to the present invention.

A resin-encapsulated semiconductor device of QFP structure according to the present invention is shown in FIG. 1 (a plan view of essential portions) and FIG. 2 (a sectional view taken along a cutting-plane line II—II in FIG. 1).

As shown in FIGS. 1 and 2, the resin-encapsulated semiconductor device 1 adopting the QFP structure is such that a semiconductor pellet (semiconductor chip) 2 and inner leads 3A are respectively arranged on a film base 4. The semiconductor pellet 2 has a square shape (in this embodiment, a substantially regular square shape) in plan. The inner leads 3A are extended radiately in four directions about the semiconductor pellet 2. That is, the semiconductor pellet 2 is arranged in a region whose perimeter is defined by the base ends or inner ends (nearer to the pellet 2) of the inner leads 3A. The other end sides or outer end sides of the inner leads 3A are made unitary with outer leads (pins) 3B. All of the semiconductor pellet 2, inner leads 3A and film base 4 are hermetically sealed with a resin mold 5. The resin mold 5 has a square plan shape whose lateral are substantially parallel to the lateral of the square shape of the semiconductor pellet 2. The resin-encapsulated semiconductor device 1 adopting the QFP structure in this embodiment is constructed with an outward size of $40 \times 40$ [mm$^2$] (in terms of the size of the resin mold 5), and is provided with the outer leads 3B in a number of 232. The thickness of the resin mold 5 is about 4 [mm].

The semiconductor pellet 2 is formed of, for example, single-crystal silicon. Although no restriction is meant, the semiconductor pellet 2 has a pellet size of about $11.4 \times 11.4$ [mm$^2$] and a thickness of about 0.4 [mm]. A predetermined circuit constituted by a plurality of semiconductor elements is included in the element forming domain of the front surface of the semiconductor pellet 2. Although not especially restricted, the semiconductor pellet 2 can consist of a CMOS gate array.

The base ends of the inner leads 3A are arrayed along the laterals of the semiconductor pellet 2 so as to confront them. The inner leads 3A are extended radiately in the four directions about the semiconductor pellet 2 as described before, whereby the resin-encapsulated semiconductor device 1 adopting the QFP structure is constructed of a so-called "quadridirectional lead structure". The inner leads 3A and the outer leads 3B are made of, for example, an Fe-Ni alloy (containing 42 or 50 [%] of Ni by way of example). All of the inner leads 3A and the outer leads 3B are formed from an identical lead frame. The lead frame is worked by punching or etching a plate of the above alloy. Each of the inner leads 3A and outer leads 3B is formed at a thickness of, for example, 0.15 [mm].

Alternatively, the inner leads 3A and the outer leads 3B may well be made of a Cu alloy or oxygen-free copper (OFC).

Among the inner leads 3A, ones 3A to which a reference power-source voltage $V_{SS}$ is applied are made shorter than the others 3A to the extent that they overlie the peripheral part of the film base 4. By way of example, the reference power-source voltage $V_{SS}$ is the reference potential, 0 [V] of the circuitry included in the semiconductor pellet 2. The circuitry of the semiconductor pellet 2 is fed with an operating power-source voltage $V_{CC}$ through the longer inner leads 3A (which may well be short). By way of example, the operating power-source voltage $V_{CC}$ is the operating potential, 5 [V] of the circuitry.

A plurality of external terminals (bonding pads) 9 are arranged at the outer peripheral part of the front surface of the semiconductor pellet 2. The base ends of the inner leads 3A and the respectively corresponding ones of the external terminals 9 are electrically connected through pieces of bonding wire 6. Used as the bonding wire 6 is, for example, Au wire, the diameter of which is about 30-32 [μm] by way of example. The bonding wire pieces 6 are bonded by the ball bonding method or the wedge bonding method though not restricted. As shown in FIG. 2, a metal plating layer 8 is provided on the front surface of that bonding region of each inner lead 3A to which one end of the bonding wire piece 6 is connected. The metal plating layer 8 is, for example, an Ag plating layer, which is formed at a thickness of about 5-10 [μm] by way of example. This metal plating layer 8 is deposited for the purpose of enhancing bonding between the inner lead 3A and the bonding wire piece 6. Each of the external terminals 9 of the semiconductor pellet 2 is basically formed of an aluminum alloy film. The aluminum alloy film is made of the same conductor layer as that of wiring for connecting circuits assembled in the semiconductor pellet 2. The front surface of that region of each external terminal 9 to which the other end of the bonding wire 6 is connected is formed with, at least, a metal film which enhances the bonding.

As shown in FIG. 2, the film base 4 is constructed of a multilayer structure in which an insulating member 4A, a metal plate 4B and a covering member 4C are stacked in this order from the top side (the pellet mounting side). The film base 4 in this embodiment is constructed of the three-layer structure as depicted in FIG. 2.

The insulating member 4A of the film base 4 is bonded on the front surface of the metal plate 4B on the side on which the semiconductor pellet 2 is mounted. This insulating member 4A is chiefly intended to electrically isolate the metal plate 4B and the individual inner leads 3A. It is made of a film of glass epoxy resin and is formed with a thickness of, for example, about 1.0 [mm]. It has a size smaller than the planar size of the resin mold 5, and it is extended over substantially the whole extent of the resin mold 5. Concretely, it is formed into a relatively large size of about 38 > 38 [mm²] *by way of example.*

The insulating member 4A and each of the inner leads 3A are bonded by an adhesion layer not shown. Used as the adhesion layer is, for example, an adhesive of epoxy resin in the shape of a tape which has a thickness of about 20 [μm]. The tape of the epoxy resin adhesive is stuck on, at least, the whole extent in which the insulating member 4A and each of the inner lead 3A are placed on each other. As shown in FIG. 1, tape supporting leads 3C are laid along the inner leads 3A from the corners of the resin mold 5 to the vicinities of the corners of the semiconductor pellet 2. The tape supporting leads 3C are formed from the same lead frame as that of the inner leads 3A as well as the outer leads 3B. They are used as the overlap widths of the tape-shaped epoxy adhesive, thereby making it possible to reduce the dispersion of the positions of the inner leads 3A.

A pellet mounting window 4K is provided centrally on the insulating member 4A, and it exposes the front surface of the underlying metal plate 4B. The semiconductor pellet 2 is mounted on the front surface of the metal plate 4B within a region defined by the pellet mounting window 4K. A metal plating layer 7 is provided on that part of the front surface of the metal plate 4B which is defined by the pellet mounting window 4K. The metal plating layer 7 is, for example, a composite plating layer in which an Ni plating layer and an Au plating layer are successively stacked. The Ni plating layer serves to decrease the amount of use of Au for the Au plating layer, and to enhance the adhesion between the front surface of the metal plate 4B and the Au plating layer. This Ni plating layer is formed at a thickness of, for example, about 1-8 [μm]. The Au plating layer is formed for the purpose of producing an Au-Si eutectic alloy with the rear surface of the semiconductor pellet 2. (Incidentally, the Au plating layer of metal plating layer 7 in each of bonding recesses 4D and 4E to be described later is intended to enhance bonding.) The Au plating layer is formed at a thickness of, for example, about 0.3-1.0 [μm]. It is formed at a thickness of or above 1.0 [μm] when the amount of diffusion thereof with the Ni plating layer is large. After all, the semiconductor pellet 2 and the metal plate 4B are secured forming a layer of the Au—Si eutectic alloy by interposing the metal plating layer 7 therebetween. Alternatively, they may well be bonded with an adhesive such as resinous paste.

The bonding recesses 4D are provided near the perimeter of the pellet mounting window 4K of the insulating member 4A of the film base 4. They are arranged near those external terminals 9 of the semiconductor pellet 2 to which the reference power-source voltage $V_{SS}$ is applied. Although not especially restricted there are eight recesses 4D are in this embodiment. On the other hand, the bonding recesses 4E are provided in the peripheral part of the insulating member 4A (near the outer leads 3B). They are arranged near the base ends of the foregoing shorter inner leads 3A to which the reference power-source voltage $V_{SS}$ is applied. Although no restriction is meant, each of the bonding recesses 4D and the bonding recesses 4E is formed on a through hole penetrating the insulating member 4A and having a diameter of 1.0 [mm] by way of example. That is, each of the bonding recesses 4D and 4E exposes the front surface of the metal plate 4B. The bonding recesses 4D are used as openings for electrically connecting the metal plate 4B and those external terminals 9 of the semiconductor pellet 2 to which the reference power-source voltage $V_{SS}$ is applied. Likewise, the bonding recesses 4E are used as openings for electrically connecting the metal plate 4B and the inner leads 3A to which the reference power-source voltage $V_{SS}$ is applied. The connections between the external terminals 9 and the metal plate 4B, and the connections between the inner leads 3B and the metal plate 4B are effected with pieces of bonding wire 6. This bonding wire 6 is the same as the bonding wire 6 used for connecting the inner leads 3A and those external terminals 9 of the semiconductor pellet 2 to which signals and the operating power-source voltage $V_{CC}$ are applied.

The metal plate 4B connected to both the external terminals 9 and inner leads 3A to which the reference power-source voltage $V_{SS}$ is applied, is used as wiring for the reference power-source voltage for electrically connecting these external terminals 9 and inner leads 3A. As seen from FIG. 1, the metal plate 4B functioning as the reference power-source voltage wiring has a widthwise dimension which is considerably greater than that of each inner lead 3A. In a simple calculation, the metal plate 4B is formed having an area which corresponds to the 232 inner leads 3A, and the inner leads 3A to which the reference power-source voltage $V_{SS}$ is applied are laid in the number of 8, so that the widthwise dimension of the metal plate 4B is equivalent to the sum of the widthwise dimensions and separation dimensions of 29 of the inner leads 3A to which the reference power-source voltage $V_{SS}$ is applied.

The metal plate 4B is made of a material of good electric conductivity, and a material also exhibiting a thermal conductivity that is most suitable. More specifically, the metal plate 4B should preferably have a low resistivity because it is used as the reference power-source voltage wiring as stated before. In addition, the metal plate 4B should preferably have a low thermal resistivity in order that heat generated by the operation of the circuitry assembled in the semiconductor pellet 2 may be permitted to radiate from the side of the rear surface (the surface opposite to the circuit forming surface) of the semiconductor pellet 2 to the exterior of the resin-encapsulated semiconductor device through the resin mold 5. The metal plate 4B on which the semiconductor pellet 2 is directly mounted (which is the same layer as the metal plate 4B functioning as the reference power-source voltage wiring, but which is electrically isolated therefrom) is formed having a size which is somewhat larger than the plan area of the semiconductor pellet 2, and it is so constructed that the heat generated by the semiconductor pellet 2 can be emitted to the exterior owing to the larger area. The metal plate 4B is formed of, for example, a Cu plate (Cu foil), which is about 0.6–0.8 [mm] thick. Alternatively, the metal plate 4B may well be made of an Fe—Ni alloy (containing 42 or 50 [%] of Ni).

The metal plate 4B is divided into a plurality of parts in an identical layer. In this embodiment, it is divided into 4 parts (into 5 parts when the region on which the semiconductor pellet 2 is mounted is reckoned). In this embodiment, all of the four divisional parts of the metal plate 4B are used as the wiring for the identical reference power-source voltage. Although not especially restricted, the respective divisional parts of the metal plate 4B can be individually used for an input-stage circuit, an output-stage circuit and internal circuits. Also, they can be individually used as the wiring for the reference power-source voltage and wiring for the operating power-source voltage. That is, a plurality of power-source voltages can be respectively applied to the parts of the metal plate 4B divided in the identical layer.

The metal plate 4B has substantially the same shape as the plan shape of the insulating member 4A, and it is formed so as to be at least, for example, about 0.2 [mm] smaller than the plan size of the insulating member 4A. As will be described later, the contraction of the size of the metal plate 4B is controlled by etching or the like. The contracted size of the metal plate 4B is intended to prevent the metal plate 4B from being burred due to its ductility at the end surface of the film base 4 at the stage of punching the outward shape of this film base 4. The appearance of the burrs incurs short-circuiting between the metal plate 4B and the inner leads 3A at the end surface of the film base 4. The contraction of the size of the metal plate 4B can consequently increase the separation dimensions between this metal plate 4B and the inner leads 3A owing to the interposition of the insulating member 4A.

The covering member 4C of the film base 4 is bonded on that rear surface of the metal plate 4B which is opposite to the surface having the insulating member 4A bonded thereon. By way of example, this covering member 4C is formed of a solder resist film (such as thermosetting resin film) which has an insulating property and which is about 10–20 [μm] thick. It is used as a mask for plating for forming the metal plating layers 7 on only those regions of the front surface of the metal plate 4B on the side of the insulating member 4A which are respectively defined by the bonding recesses 4D, 4E and the pellet mounting window 4K. Moreover, it can enhance the adhesive property between the film base 4 and the resin mold 5 as compared with the metal plate 4B.

The covering member 4C has substantially the same plan shape and plan size as that of the insulating member 4A. That is, the covering member 4C is formed so as to be larger than the plan size of the metal plate 4B, and it covers the end surface of this metal plate 4B. Thus, it can further diminish the region where the metal plating layer 7 is unnecessary.

The film base 4 is provided with a plurality of through holes 4F as shown in FIGS. 1 and 2. The through holes 4F bring the parts of the resin mold 5 above and below the film base 4 into close adhesion through all of the insulating member 4A, metal plate 4B and covering member 4C of the film base 4. Although no restriction is meant, the through holes 4F are regularly arranged in a plural number within each of those regions of the film base 4 which are defined by the bonding recesses 4D, 4E. Regarding each of the through holes 4F, in the same manner as at the edge part of the film base 4, a through hole part in the metal plate 4B is formed larger than a through hole part (4f in FIG. 3) in the insulating member 4A. Besides, the surface of that through hole part of the through hole 4F which is formed in the metal plate 4B is covered with the covering member 4C. Although not especially restricted, the through hole 4F is formed having substantially the same size as the size of the bonding recess 4D or 4F.

As illustrated in FIG. 1, the resin-encapsulated semiconductor device 1 of the QFP structure adopts a method in which a pouring port (resin gate) for a resin in a resin-sealing operation is located at an upper left part in the figure and in which the resin is poured toward a lower right part (in the direction of an arrow G). That is, the resin pouring port is located at one corner of the resin mold 5. The corner of the resin mold 5 serving as the resin pouring port is cut away as compared with any other corner thereof, whereby the size of the resin pouring port can be set large. The resin-encapsulated semiconductor device 1 of the QFP structure adopting such a pouring method is provided with a cutout 4G in that vicinal part of the film base 4 which confronts the resin pouring port. The cutout 4G is formed in such a shape that the corresponding corner of the film base 4 is cut off at an angle of about 45 [degrees] to the lateral of the film base 4 defining the corner. The corner of the film base 4 for the cutout 4G is cut off along a line which connects the points of the respective sides spaced about 5-6 [mm] from the tip of the corner. The cutout 4G can enlarge the sectional size of the outflow paths of the resin which flows across spaces over and under the film base 4 in the resin-sealing operation. That is, the cutout 4G is provided lest the flow of the resin should be hampered by the film base 4 occupying the greater region of a metal mold (corresponding to the resin mold 5) used in the resin-sealing operation, and lest voids should appear.

In addition, the film base 4 is provided with cutouts 4H, 4I and 4J each being substantially the same as the cutout 4G, at all the corners thereof other than the corner close to the resin pouring port. That is, the film base 4 is formed with the cutouts 4G-4J at all its corners, whereby a symmetry is afforded so as to render the flow of the resin still better. Moreover, likewise to the through holes 4F formed in the film base 4, the cutouts 4G-4J can enhance the adhesive property between the parts of the resin mold 5 above and below the film base 4.

The resin mold 5 is made of, for example, a phenol-setting epoxy resin. Silicone rubber and a filler are added into the phenol-setting epoxy resin. The silicone rubber functions to lower the coefficient of thermal expansion of the phenol-setting epoxy resin. The filler is formed of grains of silicon oxide, which similarly function to lower the coefficient of thermal expansion of the phenol-setting epoxy resin. Thus, the phenol-setting epoxy resin exhibits a low thermal expansion and therefore undergoes low stresses.

Now, a method of producing the resin-encapsulated semiconductor device of the QFP structure 1 will be briefly described with reference to FIGS. 3 thru 9 (sectional views of essential portions showing respective steps for production).

First, the material of an insulating member 4A to constitute a film base 4 is prepared. In this regard, the material of the insulating member 4A is formed in the shape of a tape so as to be capable of fabricating the insulating members 4A of the film bases 4 of a plurality of resin-encapsulated semiconductor devices of the QFP structure 1. The insulating member 4A is previously formed with a pellet mounting window 4K, bonding recesses 4D and 4E, and through hole parts 4f which constitute through holes 4F. The pellet mounting window 4K, bonding recesses 4D and 4E, and through hole parts 4f are respectively provided by, for example, punching.

Figures 3, 4, 5:
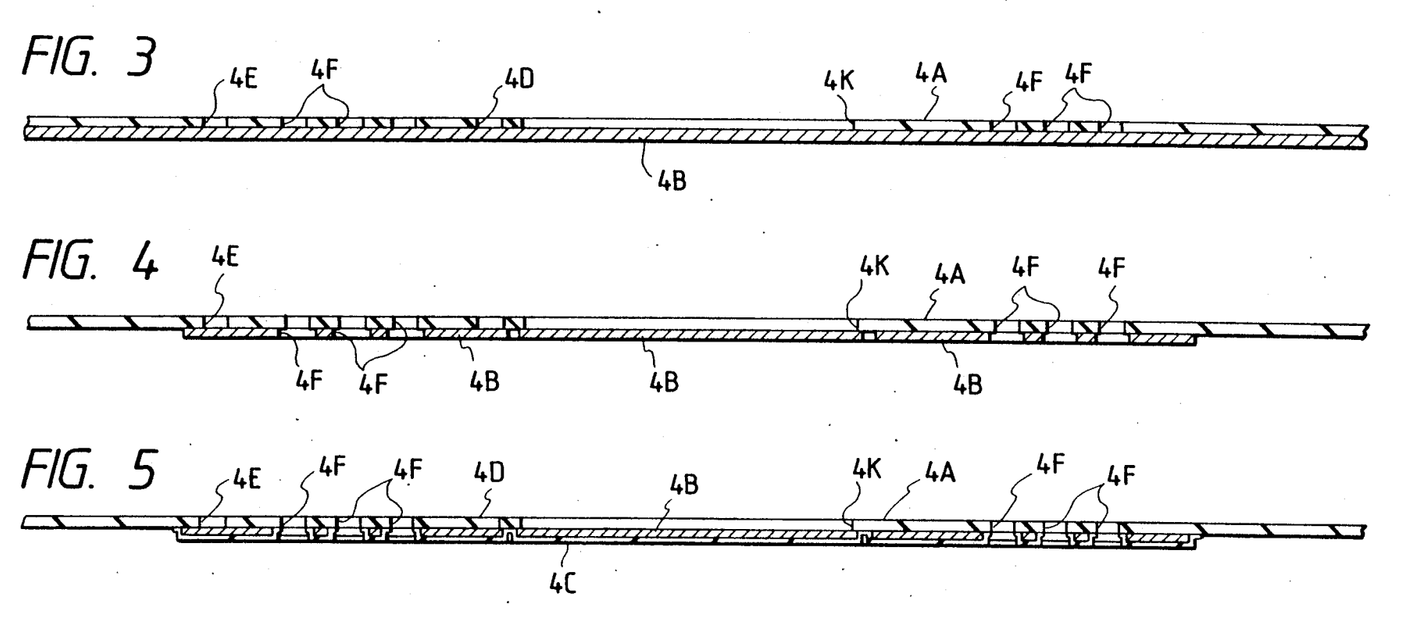
FIGS. 3 thru 9 are sectional views of essential portions showing the resin-encapsulated semiconductor device at the respective production steps thereof.

Subsequently, as shown in FIG. 3, a metal plate 4B is bonded on the rear surface of the insulating member 4A. In a case where the insulating member 4A has an adhesive backing, the metal plate 4B is directly stuck, and in a case where the insulating member 4A has no adhesive backing, this insulating member 4A is stuck through an adhesive.

Subsequently, as shown in FIG. 4, the metal plate 4B is patterned to define the shape illustrated in the plan view of FIG. 1, namely, the outward shape thereof, and to be formed with through hole parts which constitute the through holes 4F. On this occasion, the metal plate 4B is patterned with isotropic etching by the use of an etching mask which has been prepared by photolithography. The metal plate 4B the end surface of which defines the outward shape of the film base 4, is endowed with a size which is somewhat smaller than the outward dimension of the film base 4 to be defined later. The contraction of the size of the metal plate 4B can be effected by the side etching of the etching process or by reducing the size of the etching mask beforehand. Along with the contraction of the dimension of the metal plate 4B, each of the through hole parts in this metal plate 4B is formed having a size larger than that of the through hole part 4f in the insulating member 4A. By providing the through hole parts in the metal plate 4B, the through holes 4F of the film base 4 are nearly finished up together with the through hole parts 4f provided in the insulating member 4A. Besides, the metal plate 4B can be divided into a plurality of parts for respective power-source voltages by the patterning of this metal plate 4B.

At the next step, as shown in FIG. 5, a covering member 4C is formed on the exposed surface of the metal plate 4B. The covering member 4C is formed by coating the metal plate 4B with a film of solder resist, for example, a film of thermosetting resin and then setting it. In addition, the thermosetting resin applied to only the selected parts of the surface of the metal plate 4B.

Next, metal plating layers 7 are formed on those exposed regions of the front surface of the metal plate 4B which are respectively defined by the pellet mounting window 4K and the bonding recesses 4D, 4E. In forming the metal plating layers 7, the insulating member 4A and the covering member 4C are used as a mask for plating. Accordingly, the metal plating layers 7 are formed on the small number of defined regions.

Figure 6:
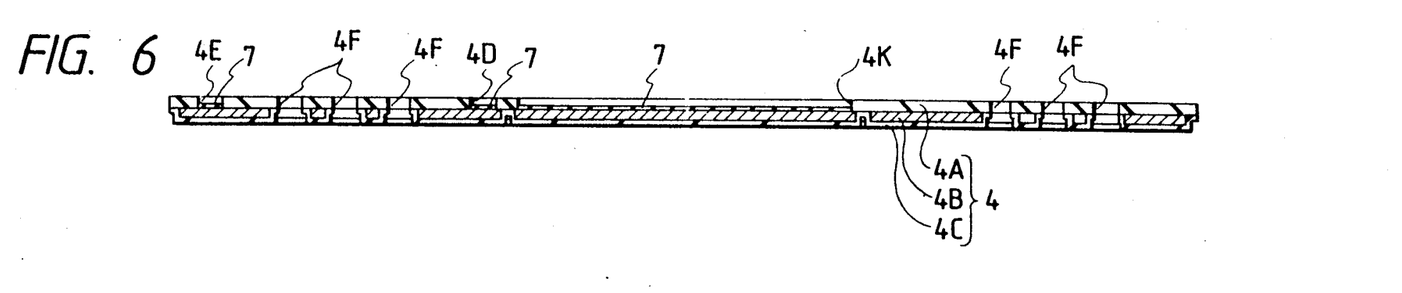

Next, as shown in FIG. 6, chiefly that region of the insulating member 4A which defines the outward shape thereof is punched by machining, thereby to finish up the film base 4. Since the metal plate 4B of the film base 4 is endowed with the size smaller than that of the punched region of the insulating member 4A for the outward shape, any tool does not abut against the metal plate 4B during the punching, and the burrs of metal plate 4B do not appear.

By the way, regarding the formation of the through holes 4F of the film base 4, in a case where such an obstacle is involved that the covering member 4C fills up the through holes 4F, the through hole parts 4f of the insulating member 4A may well be formed by punching simultaneously with the punching for the outward shape of the film base 4.

Figures 7, 8:
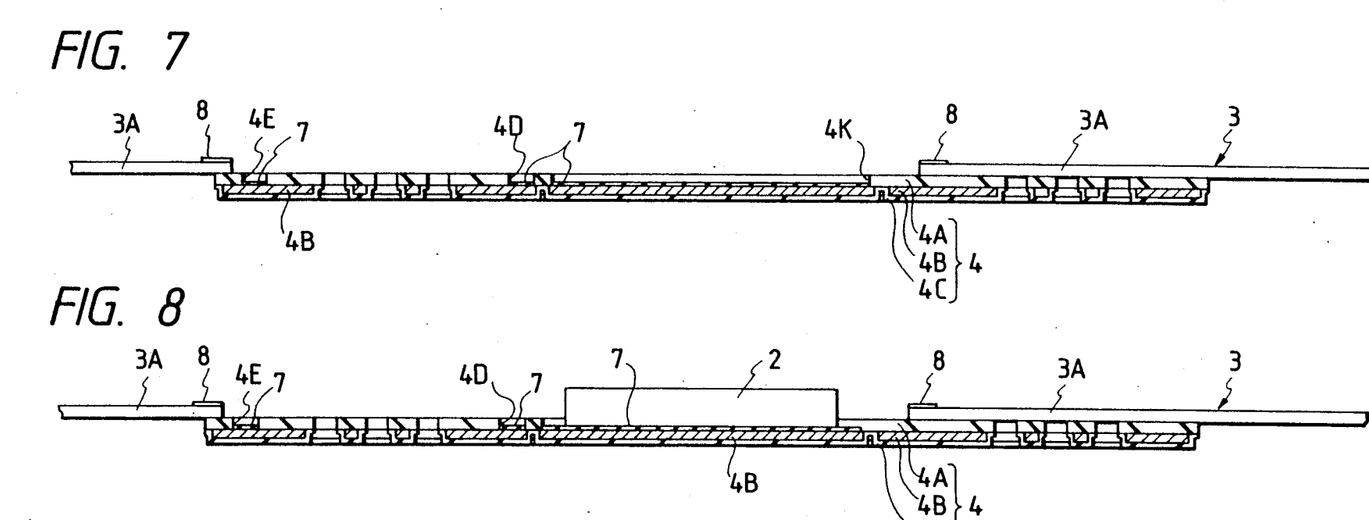

At the next step, as shown in FIG. 7, inner leads 3A are bonded on the front surface of the insulating member 4A of the film base 4. The bonding of the inner leads 3A to the film base 4 is effected with an epoxy adhesive, not shown, which is stuck on the front surface of the insulating member 4A. At this step, the inner leads 3A are in the state in which they are supported together with outer leads 3B by a lead frame through a tie bar 3D which is indicated by dot-and-dash lines in FIG. 1. The lead frame is fabricated by punching or etching, and the front surface of each inner lead 3A near the base end or inner end thereof is formed with a metal plating layer 8 beforehand at the step of fabricating the lead frame.

Subsequently, as shown in FIG. 8, a semiconductor pellet 2 is mounted on that region of the front surface of the metal plate 4B of the film base 4 which is defined by the pellet mounting window 4K. The semiconductor pellet 2 is secured to the front surface of the metal plate 4B through the metal plating layer 7.

Figure 9:
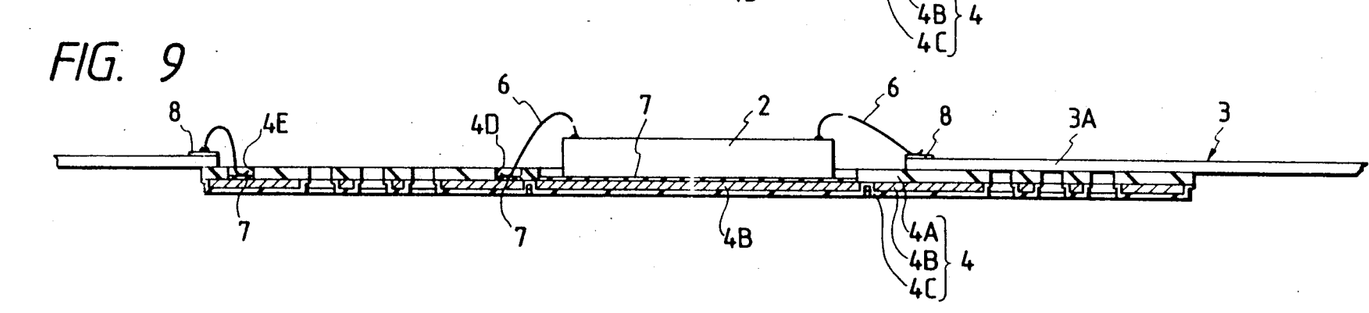

Subsequently, as shown in FIG. 9, a bonding step is carried out to electrically connect the external terminals of the semiconductor pellet 2 and the inner leads by the use of pieces of bonding wire 6. Simultaneously with the connections, the bonding step electrically connects the metal plate 4B of the film base 4 and those external terminals of the semiconductor pellet 2 to which a reference power-source voltage $V_{SS}$ is applied, and the metal plate 4B and the inner leads 3A to which the reference power-source voltage $V_{SS}$ is applied, by the use of pieces of bonding wire 6. The former connections are effected through the bonding recesses 4D, and the latter connections through the bonding recesses 4E.

Next, the film base 4, semiconductor pellet 2 and inner leads 3A are all sealed with a resin, thereby to form a resin mold 5.

Lastly, outer leads 3B which protrude out of the resin mold 5 are cut away from the tie bar 3D and are bent. Then, the resin-encapsulated semiconductor device of the QFP structure 1 shown in FIGS. 1 and 2 is finished up.

In this manner, in a resin-encapsulated semiconductor device of QFP structure 1, a semiconductor pellet 2 is arranged on a substantially central part of a film base 4 in which a metal plate 4B is overlaid with an insulating member 4A, while inner leads 3A are arranged on a peripheral part of the film base 4 in a state in which they are electrically isolated from the metal plate 4B of the film base 4, and external terminals for a reference power-source voltage $V_{SS}$ among external terminals of the semiconductor pellet 2 and middle parts of the metal plate 4B of the film base 4, and inner leads 3A for the reference power-source voltage $V_{SS}$ among inner leads 3A and peripheral parts of metal plate 4B are electrically connected by pieces of bonding wire 6, respectively. Owing to this construction, the external terminals for the reference power-source voltage $V_{SS}$ and the metal plate 4B, and the inner leads 3A for the reference power-source voltage $V_{SS}$ and the metal plate 4B, which are in connecting positional relationships different from each other, can be connected by the wire bonding method alone (the welding method is dispensed with), so that a connecting structure with respect to the metal plate 4B can be simplified to structurally simplify the resin-encapsulated semiconductor device of the QFP structure 1. Moreover, both the connections between the external terminals for the reference power-source voltage $V_{SS}$ and the metal plate 4B and the connections between the inner leads 3A for the reference power-source voltage $V_{SS}$ and the metal plate 4B can be effected by one wire bonding step, so that the number of connecting steps can be reduced to relieve production processing for the resin-encapsulated semiconductor device of the QFP structure 1. In addition, the metal plate 4B of the film base 4 can lower the inductance components between the external terminals for the reference power-source voltage $V_{SS}$ and outer leads 3B for the reference power-source voltage $V_{SS}$, thereby to reduce power source noise, so that the malfunctions of the semiconductor pellet 2 can be lessened to enhance the electrical reliability of the resin-encapsulated semiconductor device of the QFP structure 1. Besides, the metal plate 4B of the film base 4 can, in effect, increase the area of the rear surface of the semiconductor pellet 2, thereby to emit generated heat of the semiconductor pellet 2 to the exterior through a resin mold 5 with the larger area, so that the heat radiation efficiency of the resin-encapsulated semiconductor device of the QFP structure 1 can be raised.

In addition, the metal plate 4B of the film base 4 is divided into a plurality of portions on an identical plane in correspondence with respective sorts of power source voltages. Owing to this construction, the number of layers of the metal plate 4B of the film base 4 can be decreased (into the single layer) to simplify the structure of the film base, so that the structure of the resin-encapsulated semiconductor device of the QFP structure 1 can be simplified.

Besides, a plurality of through holes 4F are provided in the peripheral part of said film base 4. Owing to this construction, the parts of the resin of a resin mold 5 above and below the film base 4 can be bonded through the through holes 4F, so that cracks of the resin mold 5 and peeling between the film base 4 and the resin can be prevented to enhance moisture proofing of the resin-encapsulated semiconductor device of the QFP structure 1.

Also, a cutout 4G is formed at that part of the film base 4 which is close to a pouring gate for resin. Owing to this construction, the outflow paths of the resin which flows above and below the film base 4 can be increased to render the flowability of the resin favorable, so that the appearance of voids can be diminished to enhance the available percentage of the articles of the resin-encapsulated semiconductor device of the QFP structure 1.

Also, the film base 4 has a square shape in plan, and cutouts 4G, 4H, 4I and 4J are formed at all corners of the square shape of said film base 4. Owing to this construction, the outflow paths of resin which flows above and below the film base 4 are increased more and are endowed with symmetries, whereby flow of resin can be rendered more favorable, so that the available percentage of the articles of the resin-encapsulated semiconductor device of the QFP structure 1 can be enhanced.

Also, insulating member 4A of film base 4 is made somewhat larger in size than metal plate 4B thereof. Owing to this construction, in punching the outward shape of the film base 4, a punching tool does not abut against the metal plate 4B, and burrs do not appear at the end surface of the metal plate 4B, so that short-circuiting between the metal plate 4B of film base 4 and the inner leads 3A is prevented to enhance the electrical reliability of the resin-encapsulated semiconductor device of the QFP structure 1. Moreover, separation between the end part of the metal plate 4B of film base 4 and each of inner leads 3A can be increased by the insulating member 4A, so that the short-circuiting between them can be prevented to further enhance the electrical reliability of the resin-encapsulated semiconductor device of the QFP structure 1.

Meanwhile, in a method of producing the resin-encapsulated semiconductor device of QFP structure 1, there are comprised the step of forming a film base 4 in which a metal plate 4B is overlaid with an insulating member 4A having bonding recesses 4D, 4E, the step of covering an exposed lower surface of metal plate 4B of film base 4 with a covering member 4C, the step of forming metal plating layers 7 on those parts of ah upper surface of metal plate 4B of said film base 4 which are exposed through bonding recesses 4D, 4E, the step of arranging a semiconductor pellet 2 on a substantially central part of said film base 4, and also arranging inner leads 3A on a peripheral part of film base 4 in a state in which they are electrically isolated from said metal plate 4B of film base 4, the step of electrically connecting external terminals for a reference power-source voltage $V_{SS}$ among external terminals of semiconductor pellet 2 and middle parts of metal plate 4B of said film base 4, and inner leads 3A for the reference power-source voltage $V_{SS}$ among said inner leads 3A and peripheral parts of metal plate 4B by pieces of bonding wire 6 through metal plating layers 7, respectively, and the step of sealing all of film base 4, semiconductor pellet 2 and inner leads 3A with a resin mold 5. Owing to this construction, the metal plating layers 7 can be formed on only those parts of the front surface of the metal plate 4B which are defined by the bonding recesses 4D, 4E formed in the insulating member 4A of the film base 4, so that the amount of use of a metal for the metal plating layers 7 can be decreased to lower the production cost of the resin-encapsulated semiconductor device of the QFP structure 1.

Also, metal plate 4B of film base 4 is made smaller in size than each of the insulating member 4A and covering member 4C. Owing to this construction, the end part of the metal plate 4B of the film base 4 can be covered with the covering member 4C, so that the amount of use of the metal for the metal plating layers 7 can be further decreased to lower the production cost of the resin-encapsulated semiconductor device of the QFP structure 1.

Also, the semiconductor pellet 2 is mounted on that part of the surface of metal plate 4B of film base 4 from which insulating member 4A has been removed. Owing to this construction, the thermal resistance of heat emission on the side of the rear surface of the semiconductor pellet 2 can be lowered in correspondence with the removed part of the insulating member 4A of the film base 4, so that the heat radiation efficiency of the resin-encapsulated semiconductor device of the QFP structure 1 can be raised.

Incidentally, according to the present invention, in the resin-encapsulated semiconductor device of QFP structure 1, the semiconductor pellet 2 can be directly mounted on the front surface of the insulating member 4A without forming the pellet mounting window 4K in the central part of the insulating member 4A of the film base 4. In this case, those regions of the front surface of the metal plate 4B on which the metal plating layers 7 are provided (the amount of use of Au) can be decreased in correspondence with the area of the pellet mounting window 4K of the film base 4, so that the production cost of the resin-encapsulated semiconductor device of the QFP structure 1 can be lowered. Moreover, the bonding area between the insulating member 4A and metal plate 4B of the film base 4 increases, so that even in case of dividing the metal plate 4B into a plurality of portions, the adhesive property between the insulating member 4A and the metal plate 4B can be intensified to enhance the available percentage of the articles of the resin-encapsulated semiconductor device of the QFP structure 1.

Figure 10:
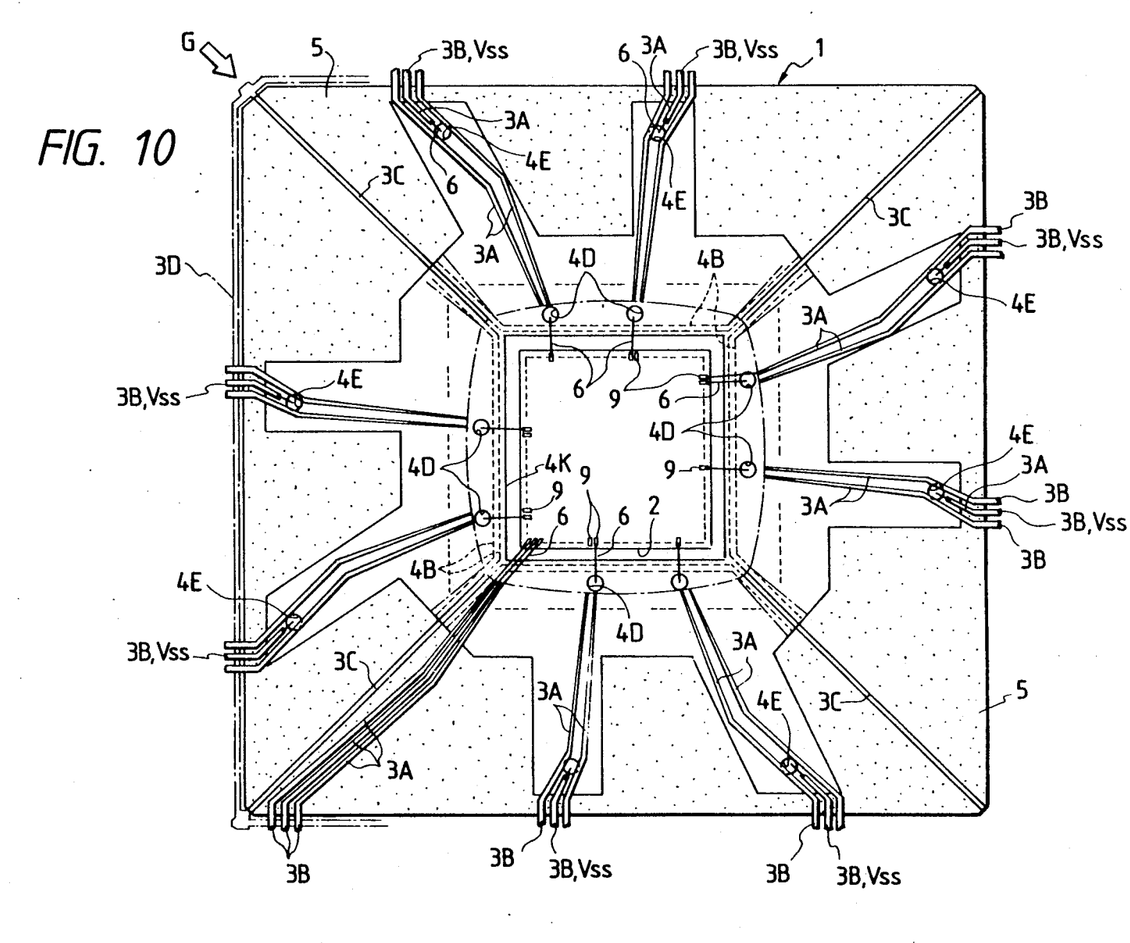
FIG. 10 is a plan view of a resin-encapsulated semiconductor device of QFP structure which is a modified embodiment of the present invention.

Now, FIG. 10 (a plan view) shows a resin-encapsulated semiconductor device of QFP structure which is a modified embodiment of the present inveniton.

As shown in FIG. 10, the resin-encapsulated semiconductor device 1 of the QFP structure in this embodiment is such that the region of a film base 4 for mounting a semiconductor pellet 2 and the region thereof to be used as wiring for a reference power-source voltage is left intact whereas the other region of the film base 4 is removed. That is, a large cutout is provided in the film base 4.

In this manner, in a resin-encapsulated semiconductor device of QFP structure 1, the region of the peripheral part of a film base 4 is removed except the region between the external terminals 9 of a semiconductor pellet 2 for a reference power-source voltage $V_{SS}$ and inner leads 3A for the reference power-source voltage $V_{SS}$. Owing to this construction, the parts of the resin of a resin mold 5 above and below the film base 4 can be bonded through the removed region of the peripheral part of the film base 4, so that cracks of the resin mold 5 and peeling between the film base 4 and the resin mold 5 can be prevented to further enhance the moisture proof of the resin-encapsulated semiconductor device of the QFP structure 1. Moreover, the outflow paths of the resin which flows across the upper and lower parts of the device with respect to the film base 4 can be increased to render the flow of resin favorable, so that the appearance of voids can be lessened to further enhance the available percentage of the articles of the resin-encapsulated semiconductor device of the QFP structure 1.

Although, in the above, the invention has been concretely described in conjunction with embodiments, it is a matter of course that the present invention is not restricted to the foregoing embodiments, but that it can be variously altered within a scope not departing from the purport thereof.

By way of example, according to the present invention, the covering member 4C of the film base 4 of the resin-encapsulated semiconductor device of QFP structure 1 may well be formed of a metal plating layer such as of an Sn—Ni alloy.

In addition, according to the present invention, the metal plate 4B of the film base 4 may well be formed of an Fe—Ni alloy plate so as to remove the covering member 4C.

Besides, the present invention is also applicable to resin-encapsulated semiconductor devices which do not adopt the QFP structure, concretely, for example it may be used for resin-encapsulated semiconductor devices of DIP (Dual Inline Package) structure, SOP (Small Out-line Package) structure, SOJ (Small Out-line J-bend) structure, ZIP (Zigzag In-line Package) structure, etc.

Effects which are attained by the typical aspects of performance of the present invention, are briefly explained as follows:

The structure of a resin-encapsulated semiconductor device can be simplified.

The production process of a resin-encapsulated semiconductor device can be relieved.

The moisture proofing of a resin-encapsulated semiconductor device can be enhanced.

The electrical reliability of a resin-encapsulated semiconductor device can be enhanced.

The available percentage of the articles of a resin-encapsulated semiconductor device can be heightened.

The production cost of a resin-encapsulated semiconductor device can be lowered.

What is claimed is:

1. A semiconductor device, comprising:
   (a) a semiconductor pellet which has pluralities of first and second bonding pads on a surface thereof;
   (b) a metal plate which has a front surface opposite a rear surface, said metal plate being larger in area than said semiconductor pellet, said semiconductor pellet being mounted on said metal plate on a central part of said front surface;
   (c) a plurality of first leads which are extended over said metal plate and insulated from said metal plate and each of said first leads has one end thereof located near said semiconductor pellet, and a plurality of second leads which are placed over said metal plate and insulated from said metal plate and each of said second leads has one end thereof located near an edge of said metal plate;
   (d) first connection means for electrically connecting each of said one ends of said first leads to the corresponding one of said first bonding pads;
   (e) second connection means for electrically connecting said metal plate to each of said second bonding pads;
   (f) third connection means for electrically connecting said metal plate to each of said one ends of said second leads; and
   (g) a resin mold which seals said semiconductor pellet, said metal plate, and parts of said first and second leads, wherein said metal plate has a plurality of through holes reaching from said front surface to said rear surface thereof.

2. A semiconductor device according to claim 1, wherein each of said second leads is a lead for a power source potential.

3. A semiconductor device according to claim 1, wherein said metal plate has a square outward shape.

4. A semiconductor device according to claim 3, wherein said metal plate has a cutout at, at least, one corner.

5. A semiconductor device according to claim 1, wherein a first insulating member is interposed between said metal plate and said first and second leads.

6. A semiconductor device according to claim 5, wherein said first insulating member is made of a glass epoxy resin.

7. A semiconductor device according to claim 5, wherein said metal plate is electrically divided into a part on which said semiconductor pellet is mounted and a part over which said first and second leads are placed.

8. A semiconductor device according to claim 5, wherein said first, second and third connection means are pieces of metal wire.

9. A semiconductor device according to claim 8, wherein said first insulating member has a plurality of bonding recesses which extend to said metal plate, and through which said metal wire pieces are electrically connected with said metal plate.

10. A semiconductor device according to claim 5, wherein said rear surface of said metal plate is covered with a second insulating member.

11. A semiconductor device according to claim 10, wherein said second insulating member is a thermo-setting resin film.

12. A semiconductor device according to claim 5, wherein said first insulating member has an outward shape larger than that of said metal plate.

13. A semiconductor device, comprising:
    (a) a semiconductor pellet which has pluralities of first and second bonding pads on a surface thereof;
    (b) a metal plate which has a front surface opposite a rear surface, said metal plate being larger in area than said semiconductor pellet, said semiconductor pellet being mounted on said metal plate on a central part of said front surface;
    (c) a plurality of first leads each of which has one end thereof located near said semiconductor pellet and placed over said metal plate and insulated from said metal plate, and a plurality of second leads which are placed over said metal plate and insulated from said metal plate and each of said second leads has one end thereof located near an outer edge of said metal plate;
    (d) first connection means for electrically connecting each of said one ends of said first leads to the corresponding one of said first bonding pads;
    (e) second connection means for electrically connecting said metal plate to each of said second bonding pads;
    (f) third connection means for electrically connecting said metal plate to each of said one ends of said second leads; and
    (g) a resin mold which seals said semiconductor pellet, said metal plate, and parts of said first and second leads, wherein said metal plate extends under portions corresponding to said second leads.

* * * * *